(12) United States Patent
Yen et al.

(10) Patent No.: US 8,575,533 B2
(45) Date of Patent: Nov. 5, 2013

(54) HIGH DYNAMIC RANGE IMAGER CIRCUIT AND METHOD FOR READING HIGH DYNAMIC RANGE IMAGE

(75) Inventors: Wen-Cheng Yen, Hsin-Chu (TW); Ching-Wei Chen, Hsin-Chu (TW); Chao-Chi Lee, Hsin-Chu (TW)

(73) Assignee: Pixart Imaging Incorporation, R.O.C., Hsin-Chu (TW)

( * ) Notice: Subject to any disclaimer, the term of this patent is extended or adjusted under 35 U.S.C. 154(b) by 190 days.

(21) Appl. No.: 13/373,265

(22) Filed: Nov. 9, 2011

(65) Prior Publication Data
US 2012/0256077 A1 Oct. 11, 2012

(30) Foreign Application Priority Data
Apr. 8, 2011 (TW) ............................. 100112180 A

(51) Int. Cl.
*H01L 27/148* (2006.01)

(52) U.S. Cl.
USPC ................. 250/208.1; 250/214 AG; 348/297; 257/296; 257/312

(58) Field of Classification Search
USPC ................. 250/208.1, 214.1, 214 R, 214 AG; 348/294, 295, 297, 308, 332; 257/239, 257/292, 296, 300, 312
See application file for complete search history.

(56) References Cited

U.S. PATENT DOCUMENTS

| 7,075,049 | B2 | 7/2006 | Rhodes et al. | |
|---|---|---|---|---|
| 7,091,531 | B2 | 8/2006 | Boemler | |
| 7,518,143 | B2 | 4/2009 | Sugawa | |
| 2013/0048831 | A1* | 2/2013 | Bikumandla | 250/208.1 |

OTHER PUBLICATIONS

IEEE Journal of Solid-State Circuits, vol. 43, No. 4, Apr. 2008.

* cited by examiner

*Primary Examiner* — Kevin Pyo
(74) *Attorney, Agent, or Firm* — Tung & Associates

(57) ABSTRACT

The present invention discloses a high dynamic range imager circuit and a method for reading high dynamic range image with an adaptive conversion gain. The high dynamic range image circuit includes a variable capacitor. The capacitance of the variable capacitor is adjusted according to sensed light intensity or by internal feedback control, to adaptively adjust the conversion gain of the high dynamic range image circuit as it reads a signal which relates to a pixel image sensed by an image sensor device. In each cycle, the signal can be read twice or more with different dynamic ranges, to enhance the accuracy of the signal.

20 Claims, 9 Drawing Sheets

VC1, VC2 = 0, 0 → $C_A = C_d$
VC1, VC2 = 0, 1 → $C_A = C_d + C_2$
VC1, VC2 = 1, 0 → $C_A = C_d + C_1$
VC1, VC2 = 1, 1 → $C_A = C_d + C_1 + C_2$

VC1, VC2 = 0, 0 → $C_A = C_d$
VC1, VC2 = 0, 1 → $C_A = C_d + C_2$
VC1, VC2 = 1, 0 → $C_A = C_d + C_1$
VC1, VC2 = 1, 1 → $C_A = C_d + C_1 + C_2$

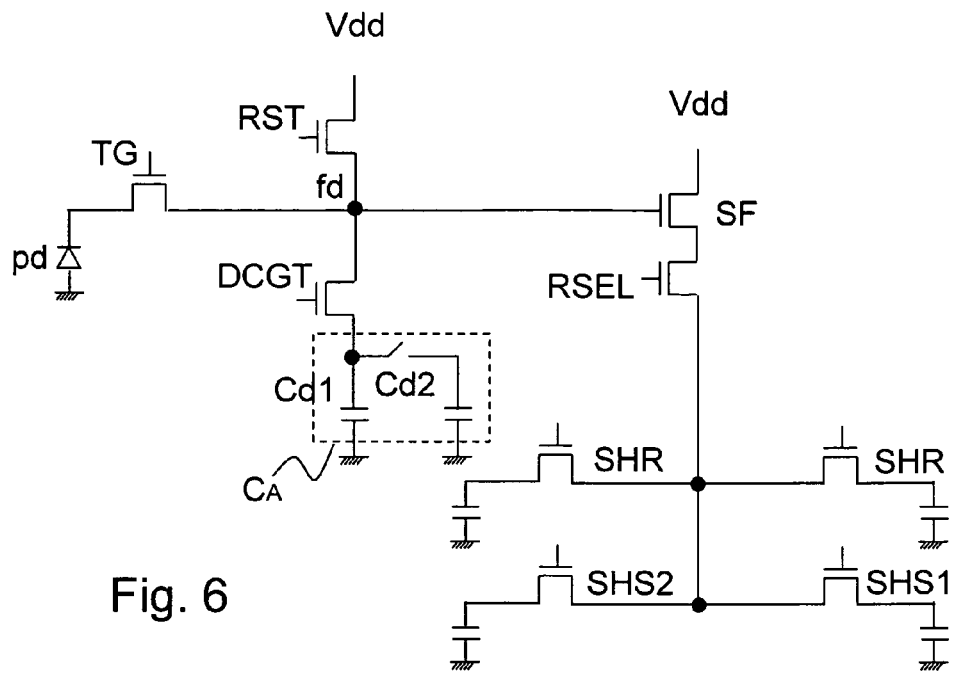
Fig. 6
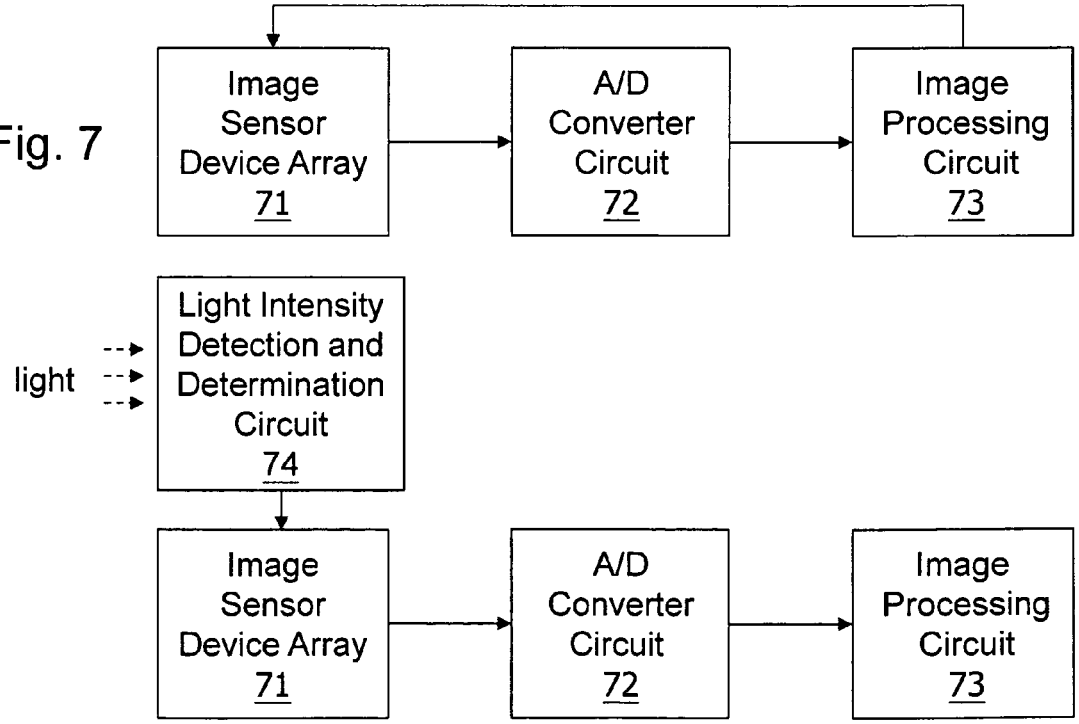
Fig. 7
Fig. 8

HIGH DYNAMIC RANGE IMAGER CIRCUIT AND METHOD FOR READING HIGH DYNAMIC RANGE IMAGE

CROSS REFERENCE

The present invention claims priority to TW 100112180, filed on Apr. 8, 2011.

BACKGROUND OF THE INVENTION

1. Field of Invention

The present invention relates to a high dynamic range imager circuit and a method for reading a high dynamic range image; particularly, it relates to such circuit and method wherein a conversion gain for reading an image is adaptively adjusted by adjusting a variable capacitor.

2. Description of Related Art

FIG. 1 shows a prior art high dynamic range image sensor device, which is disclosed by U.S. Pat. No. 7,075,049. As shown in FIG. 1, the high dynamic range image sensor device includes a dual conversion gain transistor (DCGT) and a capacitor CA for switching the image reading conversion gain, in additional to the four transistors in a conventional 4T image sensor device. FIGS. 2A-2B and FIGS. 2C-2D are schematic diagrams showing charge levels at critical nodes of the high dynamic range image sensor device shown in FIG. 1 in low light condition and high light condition respectively, to illustrate the transfer of the photo-generated charges during operation of the high dynamic range image sensor device.

In the low light condition as shown in FIGS. 2A-2B, less charges are generated by the photosensor unit pd (than in the high light condition shown in FIG. 2C). By turning OFF the transistor DCGT, the overall capacitance is lower (the capacitance of the floating diffusion node fd is constant), and therefore as indicated by the level of the floating diffusion charges shown in FIG. 2B, the conversion gain is relatively higher. On the other hand, in the high light condition as shown in FIGS. 2C-2D, more charges are generated by the pd, and because the overall capacitance is higher by turning ON the DCGT, the conversion gain is relatively lower, as indicated by the level of the floating diffusion charges shown in FIG. 2D. By reading and processing the floating diffusion charges of the above two conditions, a high dynamic range image may be obtained.

One of the drawbacks of the prior art is that only two options of the conversion gains are available, i.e., a high conversion gain and a low conversion gain, which are both fixed.

U.S. Pat. No. 7,518,143 discloses a high dynamic range image sensor device with an adjustable conversion gain, but it requires applying three voltage levels to a transfer transistor TG in the patent, wherein a second voltage level is generated by accumulating photo-generated charges.

In view of the foregoing, the present invention provides a high dynamic range imager circuit and a method for reading a high dynamic range image wherein a conversion gain for reading an image is adaptively adjusted by adjusting a variable capacitor.

SUMMARY OF THE INVENTION

The first objective of the present invention is to provide a high dynamic range imager circuit.

The second objective of the present invention is to provide a high dynamic range image sensor device.

The third objective of the present invention is to provide a high dynamic range imager apparatus.

The fourth objective of the present invention is to provide a method of reading a high dynamic range image.

To achieve the objective mentioned above, from one perspective, the present invention provides a high dynamic range imager circuit, comprising: an image sensor device formed in a first conductive type substrate, including: a photosensor unit for receiving a light signal to generate and accumulate photo-generated charges; a floating diffusion node for storing floating diffusion charges; a transfer gate for coupling the photosensor unit to the floating diffusion node to transfer at least portion of the photo-generated charges to the floating diffusion node as the floating diffusion charges; at least one variable capacitor having a capacitance which is adjustable according to an adjustment voltage; and a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges; and a signal reading circuit coupled to the image sensor device, for converting the floating diffusion charges to a signal which indicates a pixel image sensed by the image sensor device.

From another perspective, the present invention provides a high dynamic range image sensor device, comprising: a photosensor unit for receiving a light signal to generate and accumulate photo-generated charges; a floating diffusion node for storing floating diffusion charges; a transfer gate for coupling the photosensor unit to the floating diffusion node to transfer at least portion of the photo-generated charges to the floating diffusion node as the floating diffusion charges; at least one variable capacitor having a capacitance which is adjustable according to an adjustment voltage; and a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges.

From yet another perspective, the present invention provides a high dynamic range imager apparatus, comprising: a image sensor device array, including: a plurality of image sensor devices arranged in a plurality of rows and columns, each of the image sensor devices including: a photosensor unit for receiving a light signal to generate and accumulate photo-generated charges; a floating diffusion node for storing floating diffusion charges; a transfer gate for coupling the photosensor unit to the floating diffusion node to transfer at least portion of the photo-generated charges to the floating diffusion node as the floating diffusion charges; at least one variable capacitor having a capacitance which is adjustable according to an adjustment voltage; and a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges; a signal reading circuit coupled to the image sensor device, for converting the floating diffusion charges to a signal which indicates a pixel image sensed by the image sensor device; a digital-to-analog conversion circuit coupled to the signal reading circuit, for converting the signal indicating the pixel image sensed by the image sensor device to a digital image signal.

In one preferred embodiment, the high dynamic range imager apparatus further includes a light intensity determination circuit, which senses light intensity and controls the conversion gain signal or the adjustment voltage according to the light intensity.

From one another perspective, the present invention provides a method of reading a high dynamic range image, comprising: receiving a light signal to generate and accumulate photo-generated charges; transferring at least portion of the photo-generated charges to a floating diffusion node as floating diffusion charges according to a transfer signal; electrically coupling the floating diffusion node to a variable capacitor according to a conversion gain signal, for adjusting a gain of reading the floating diffusion charges, wherein the variable capacitor has a capacitance which is adjustable according to an adjustment voltage; and reading the floating diffusion charges as a first signal, which indicates a sensed pixel image.

In the aforementioned imager circuit, image sensor device, imager apparatus, and method of reading an image, preferably, the variable capacitor includes: a second conductive type region, which is formed in the first conductive type substrate; and at least one electrode, which is formed in the first conductive type substrate, for receiving the adjustment voltage to adjust the capacitance of the variable capacitor; wherein (1) an area of the electrode is controllable by the adjustment voltage to adjust the capacitance of the variable capacitor, or (2) the second conductive type region is divided to a plurality of regions by the electrode and the electrode is controllable by the adjustment voltage to selectively conduct one or more of the plurality of regions to adjust the capacitance of the variable capacitor.

In the aforementioned imager circuit, image sensor device, imager apparatus, and method of reading an image, preferably, the floating diffusion charges are read at least twice as a first signal and a second signal respectively, when the floating diffusion node is and is not coupled to the variable capacitor.

The objectives, technical details, features, and effects of the present invention will be better understood with regard to the detailed description of the embodiments below.

BRIEF DESCRIPTION OF THE DRAWINGS

FIG. 6 shows a fourth embodiment of the present invention.

FIG. 7 shows an embodiment of a system circuit of the present invention.

FIG. 8 shows that a light intensity determination circuit 74 can be provided to adjust the conversion gain signal or adjustment voltage.

DESCRIPTION OF THE PREFERRED EMBODIMENTS

The drawings as referred to throughout the description of the present invention are for illustration only, but not drawn according to actual scale.

Figure 1:
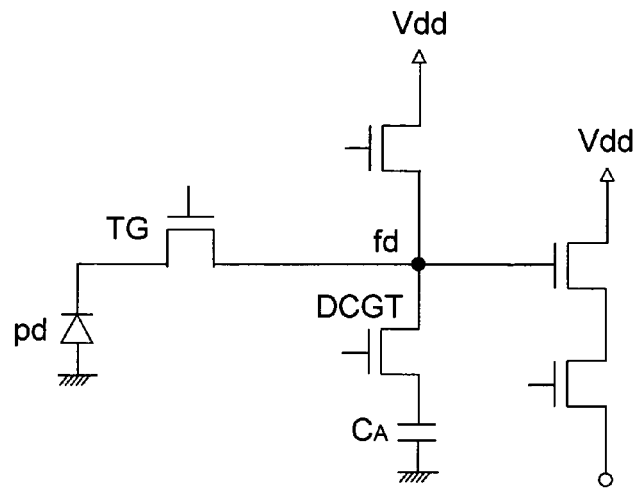
FIG. 1 shows a prior art high dynamic range image sensor device, which is disclosed by U.S. Pat. No. 7,075,049.
Figures 2A, 2B:
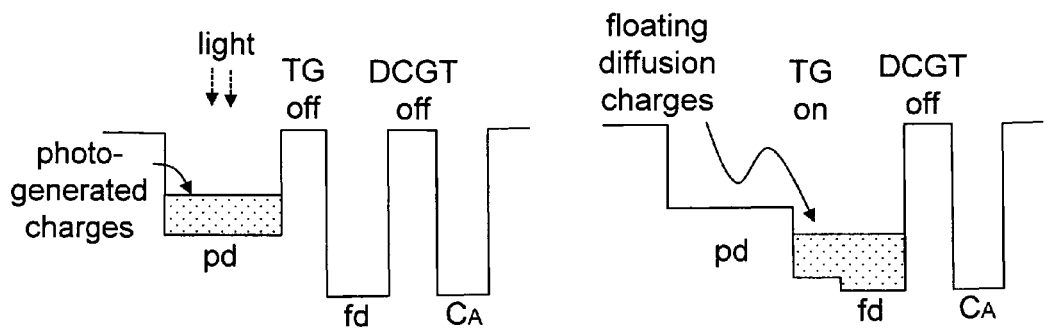
FIGS. 2A-2B and FIGS. 2C-2D are schematic diagrams showing charge levels at nodes of the high dynamic range image sensor device shown in FIG. 1 in low light condition and high light condition respectively.
Figures 2C, 2D:
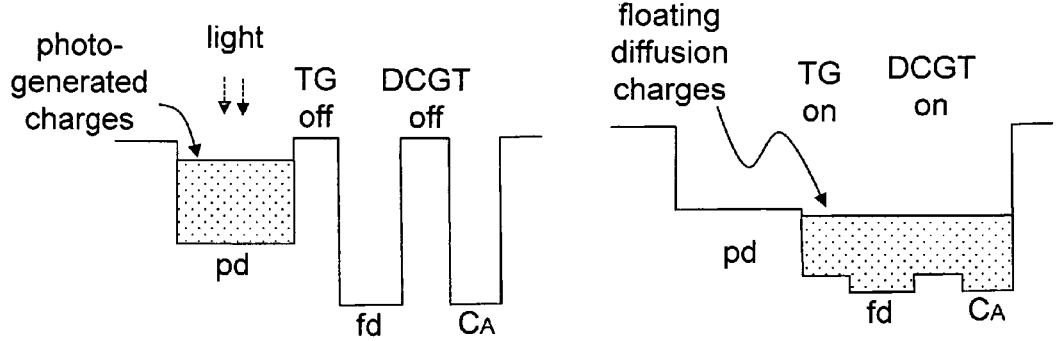
Figure 3A:
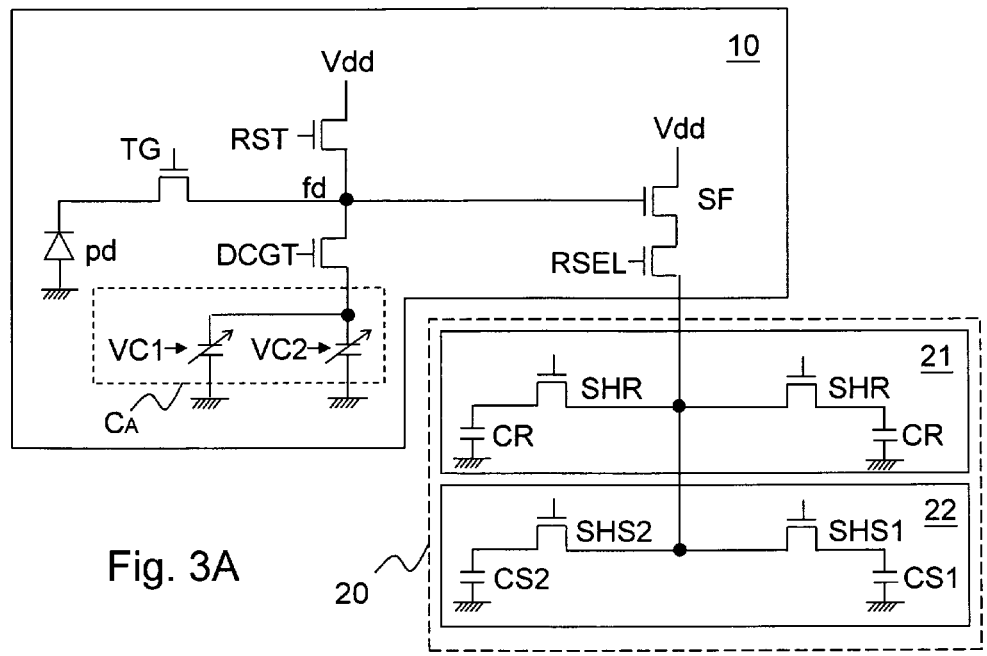
FIGS. 3A-3L show a first embodiment of the present invention.

FIGS. 3A-3L show the first embodiment of the present invention. The high dynamic range imager circuit according to the present invention includes an image sensor device 10, which is formed in a first conductive type substrate, for example but not limited to a P-type semiconductor substrate; and a signal reading circuit 20. Referring to FIG. 3A, which shows a circuit diagram of this embodiment, the image sensor device 10 includes: a photosensor unit pd, for example but not limited to a photodiode, a photogate, or a photoconductor, which is used for receiving a light signal to generate and accumulate photo-generated charges; a floating diffusion node fd for storing floating diffusion charges; a transfer gate, which is a transfer transistor TG in this embodiment, and is coupled between the photosensor unit pd and the floating diffusion node fd to transfer at least portion of the photo-generated charges to the floating diffusion node fd as the floating diffusion charges; a variable capacitor CA having an adjustable capacitance, for example but not limited to being adjustable according to adjustment voltages VC1 and VC2; a dual conversion gain transistor DCGT, which is coupled between the floating diffusion node fd and the variable capacitor CA, for receiving a conversion gain signal and electrically coupling the floating diffusion node fd to the variable capacitor CA in response to the conversion gain signal, for adjusting a gain of reading the floating diffusion charges; a reset transistor RST, which is coupled to the floating diffusion node fd in this embodiment, for resetting the floating diffusion node fd to a predetermined level, for example but not limited to an internal voltage Vdd; a source follower SF, which is coupled to the floating diffusion node fd to convert the floating diffusion charges to a signal which indicates a pixel image sensed by the image sensor device, wherein the floating diffusion charges stored in the floating diffusion node fd may be expressed in the form of a voltage; and a row selection transistor RSEL coupled to the source follower SF, the row selection transistor RSEL being controlled by a row selection signal, which enables the row selection transistor RSEL to receive the signal indicating a pixel image sensed by the image sensor device.

As shown in FIG. 3A, the high dynamic range imager circuit also includes the signal reading circuit 20, which includes: a reset signal sample and hold circuit 21, which includes reset signal sample transistors SHR and reset signal sample and hold capacitors CR connected to the transistors SHR, to sample and hold a reset signal, which is converted by the source follower SF from the predetermined level of the floating diffusion node fd; and an image signal sample and hold circuit 22, which includes for example but not limited to: a first image signal sample transistor SHS1 and a first image signal sample and hold capacitor CS1 connected to the transistor SHS1, for sampling and holding the signal for a first time; and a second image signal sample transistor SHS2 and a second image signal sample and hold capacitor CS2 connected to the transistor SHS2, for sampling and holding the signal for a second time.

Figure 3B:
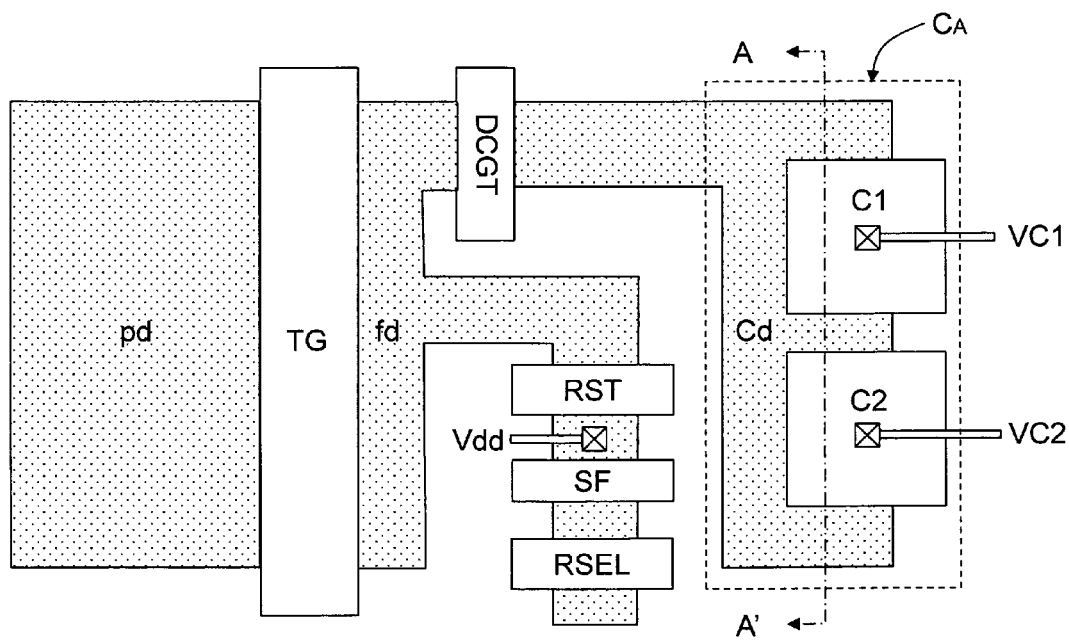
Figure 3C:
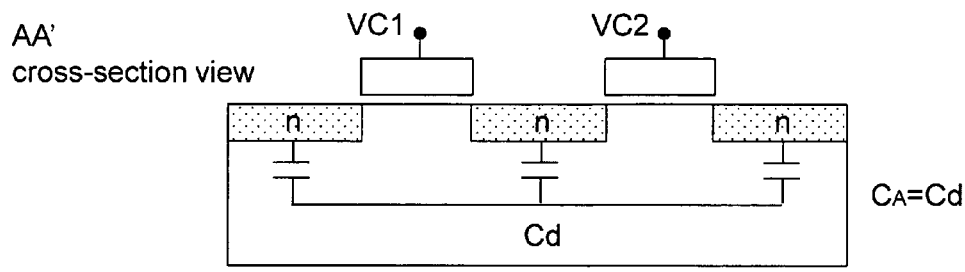
Figure 3D:
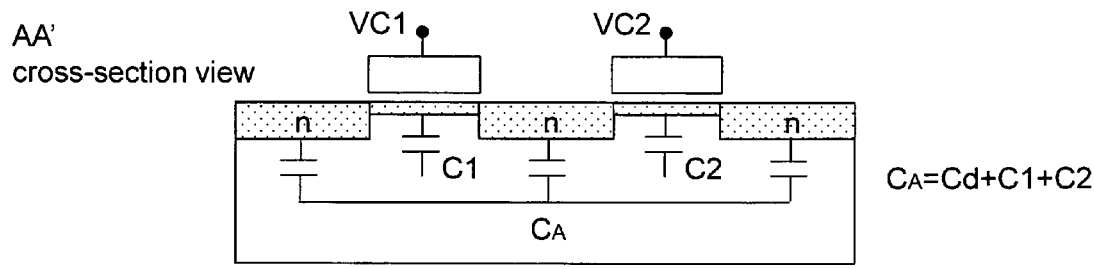

FIG. 3B shows a top view schematic diagram of the image sensor device 10 in the P-type semiconductor substrate. As shown in FIG. 3B, the variable capacitor CA includes for example but not limited to a diffusion capacitor Cd, which is an N-type doped region formed in the P-type substrate; and two capacitors C1 and C2, which are formed by two electrodes and the P-type substrate, the two electrodes C1 and C2 being respectively coupled to the adjustment voltages VC1 and VC2. FIGS. 3C and 3D are cross-section views along the cross-section line AA' in FIG. 3B, which show different conditions of the variable capacitor CA the under different adjustment voltages VC1 and VC2 respectively, to illustrate how the adjustment voltages VC1 and VC2 are used to adjust the variable capacitor CA in this embodiment. FIG. 3C shows the condition wherein the adjustment voltages VC1 and VC2 are not applied to the electrodes, or are applied to the electrodes but not enough to generate N-type regions below the electrodes. In such a condition, the capacitances of the capacitors C1 and C2 in the substrate under the electrodes are zero, so the capacitance of the variable capacitor CA is equal to the capacitance of the diffusion capacitor Cd. FIG. 3D shows the condition wherein proper adjustment voltages VC1 and VC2 are applied to the electrodes to generate N-type regions under the electrodes, and in this condition the capacitance of the variable capacitor CA is changed to a sum of the capacitances of the diffusion capacitor Cd and the capacitors C1 and C2. The adjustment voltages VC1 and VC2 can be applied in a combination of different ways, and by applying different adjustment voltages VC1 and VC2, the variable capacitor CA can be adjusted, such that when the dual conversion gain transistor DCGT is turned ON and the floating diffusion node fd is coupled to the variable capacitor CA, the gain of reading the floating diffusion charges can be adjusted as desired.

Figure 3E:
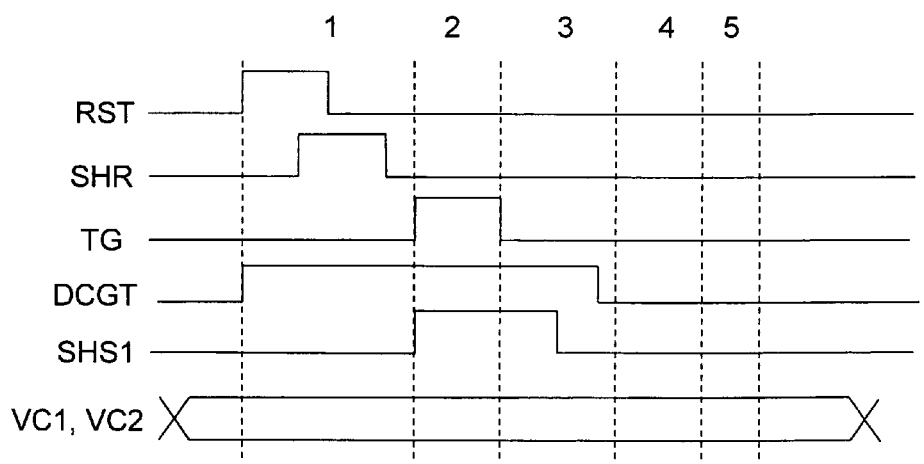

FIG. 3E shows a schematic diagram of signals which are generated according to the method of reading the high dynamic range image of the first embodiment. In this embodiment, first, the reset transistor RST resets the level of the floating diffusion node fd to a predetermined level, such as the internal voltage Vdd. Then the reset signal sample transistor SHR is turned ON, such that the reset signal sample and hold capacitor CR can receive the internal voltage Vdd as the reset signal. Next, the transfer transistor TG transfers at least portion of the photo-generated charges to the floating diffusion node fd as the floating diffusion charges, wherein the photo-generated charges are generated and stored by the photosensor unit pd according to a light signal received by the photosensor unit pd. A conversion gain signal determines whether to turn ON the dual conversion gain transistor DCGT or not, and if the dual conversion gain transistor DCGT is turned ON, the floating diffusion node fd is coupled to the variable capacitor CA. In this embodiment shown in the figure, for example, the conversion gain signal determines to turn ON the dual conversion gain transistor DCGT, which couples the floating diffusion node fd to the variable capacitor CA to adjust the gain of reading the floating diffusion charges. The capacitance of the variable capacitor CA is determined according to the adjustment voltages VC1 and VC2. As shown in the FIG. 3E, the adjustment voltages VC1 and VC2 may be in different combinations of 0 and 1, so the capacitance of the variable capacitor CA may be adjusted to Cd, Cd+C1, Cd+C2, or Cd+C1+C2 accordingly. When the first image signal sample transistor SHS1 of the image signal sample and hold circuit 22 is turned ON, the floating diffusion charges can be read as a pixel image signal and stored in the first image signal sample and hold capacitor CS1.

Figure 3F:
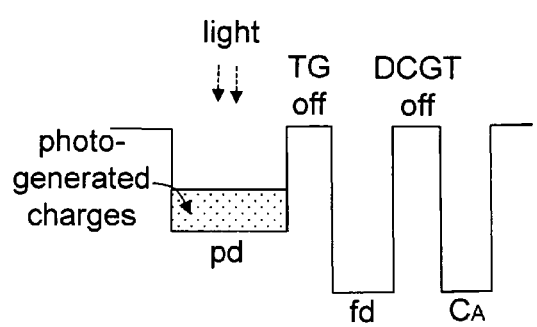
Figure 3G:
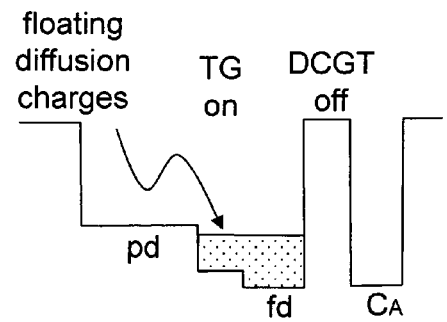
Figure 3H:
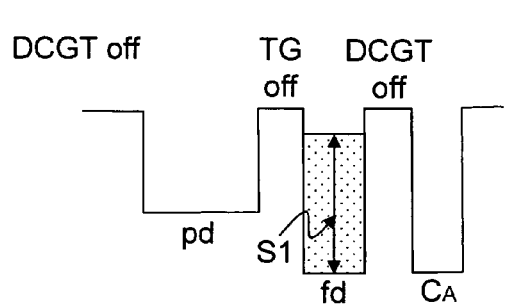
Figure 3I:
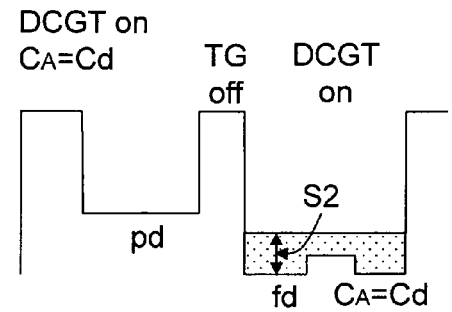
Figure 3J:
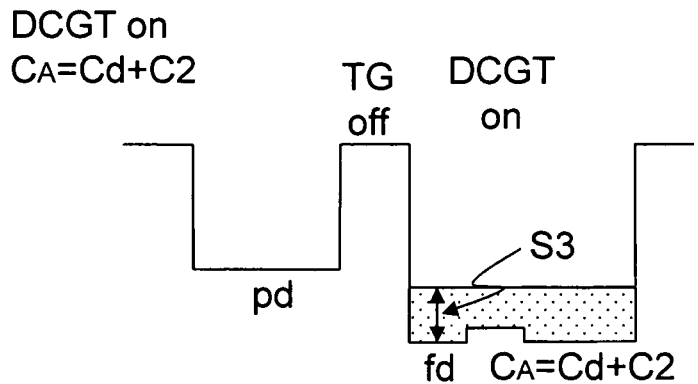
Figure 3K:
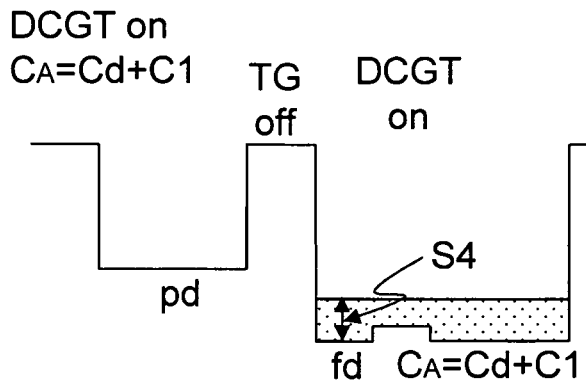
Figure 3L:
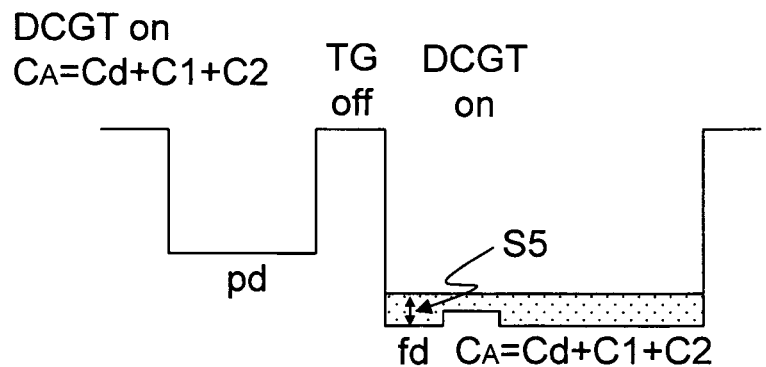

FIGS. 3F-3L show the charge levels at critical nodes and the relationship between the charge levels and the capacitances in the first embodiment, wherein the conversion gain signal determines to turn ON or OFF the dual conversion gain transistor DCGT, and the adjustment voltages VC1 and VC2 are in different combinations of 0 and 1. In the figures, the lateral axis indicates positions, and the vertical axis indicates the charge level. FIG. 3F shows that the photosensor unit pd receives a light signal indicated by dashed arrow lines, and generates and stores photo-generated charges. Referring to FIG. 3G, when the transfer signal turns ON the transfer transistor TG, the photo-generated charges are transferred to the floating diffusion node fd as the floating diffusion charges. Referring to FIG. 3H, the conversion gain signal turns OFF the dual conversion gain transistor DCGT, and the transfer signal turns OFF the transfer transistor TG, so the floating diffusion charges are stored in the floating diffusion node fd, causing a level change at the floating diffusion node fd, which is indicated by a signal S1 shown in the figure, and the signal S1 is a readable signal.

When the conversion gain signal turns ON the dual conversion gain transistor DCGT, as shown in FIGS. 3I-3L, depending on the adjustment voltages VC1 and VC2, the pixel image signal can be read out at different levels. In FIGS. 3I-3L, the adjustment voltages VC1 and VC2 are (0,0), (0,1), (1,0), and (1,1) respectively, and the capacitance of the variable capacitor CA is Cd, Cd+C2, Cd+C1, and Cd+C1+C2 correspondingly. These different values of capacitances result in different charge levels at the floating diffusion node fd, such as the signals S2, S3, S4, and S5 shown in the figures, and these signals are readable.

The above illustrates that, according to the present invention, the pixel image signal can be read out at different levels (i.e., of different conversion gains) in accordance with different light conditions, such that an image can be read out more precisely than in the prior art.

Figure 4A:
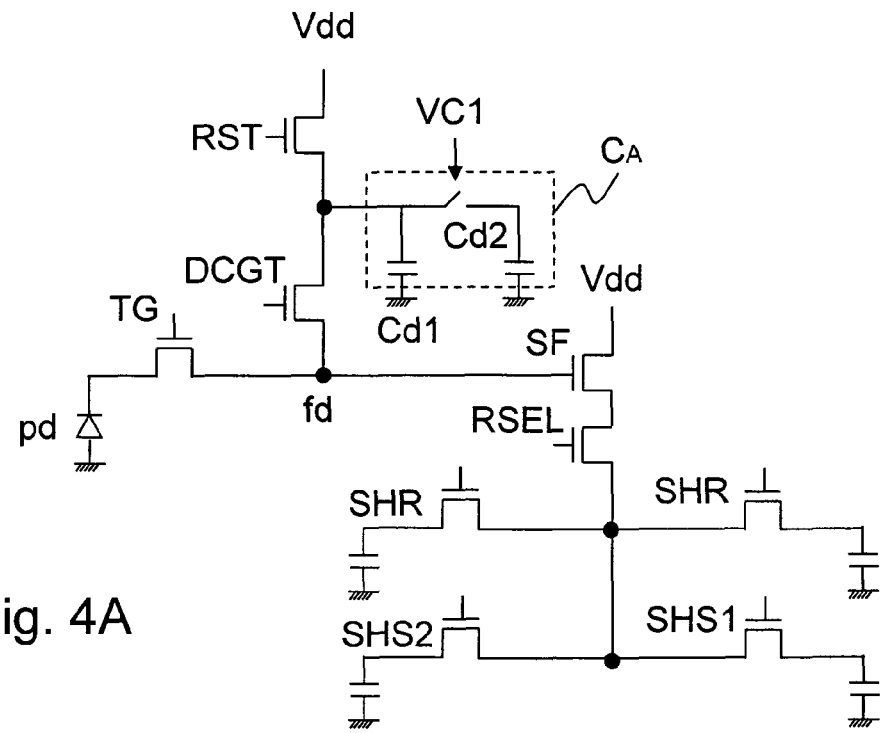
FIGS. 4A-4B show a second embodiment of the present invention.
Figure 4B:
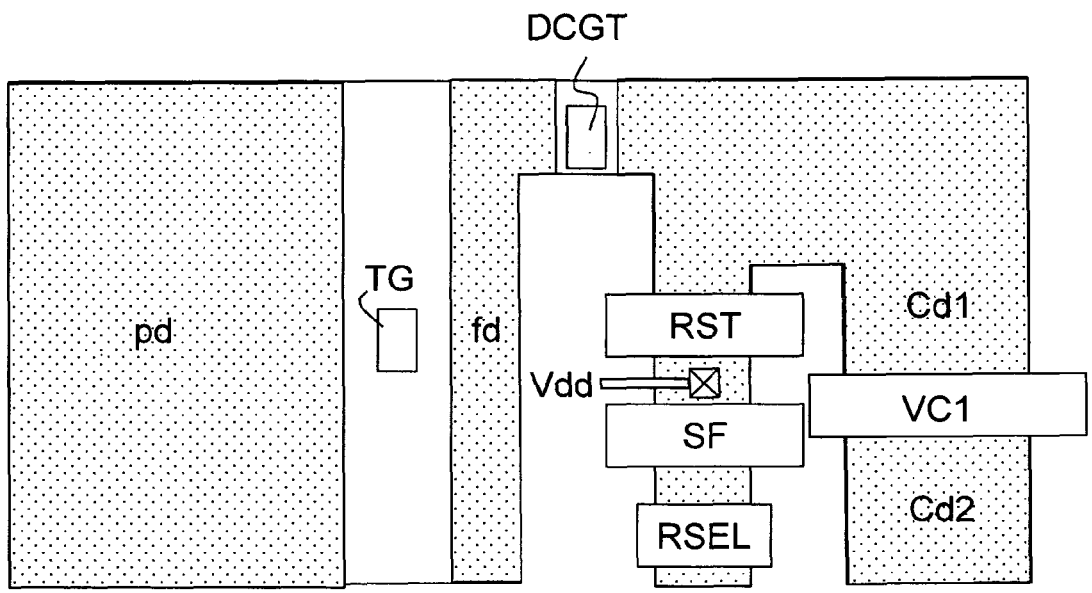
Figure 5A:
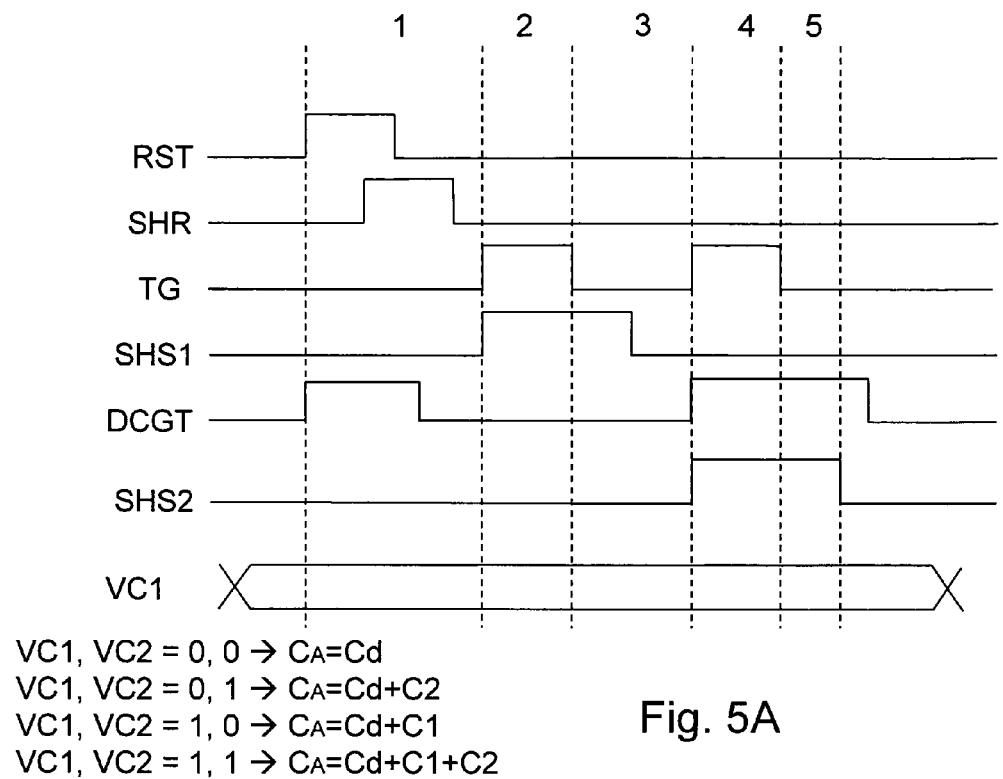
FIGS. 5A-5F show a third of the present invention.
Figures 5B, 5C:
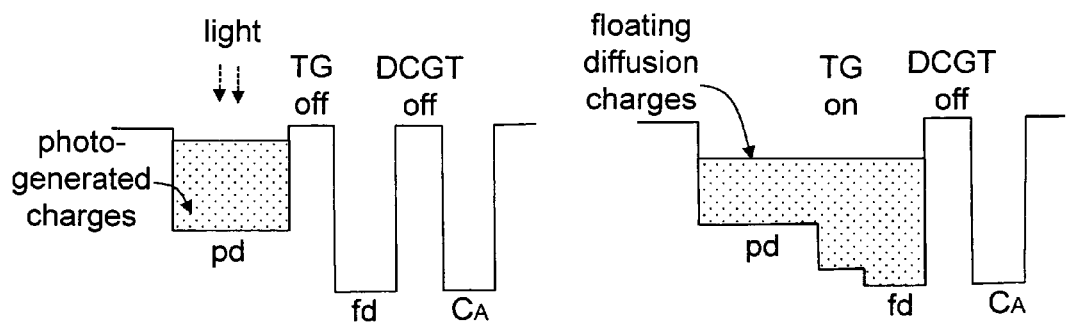
Figure 5D:
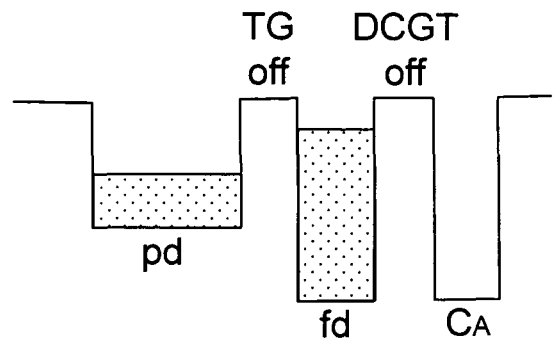
Figure 5E:
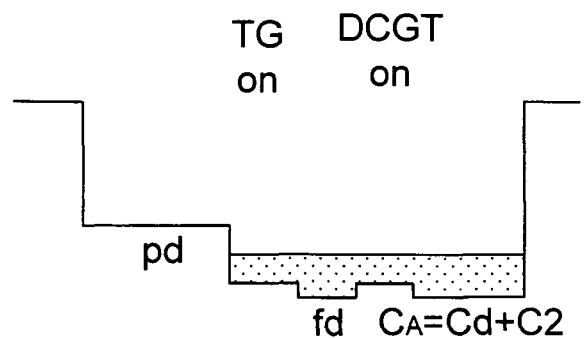
Figure 5F:
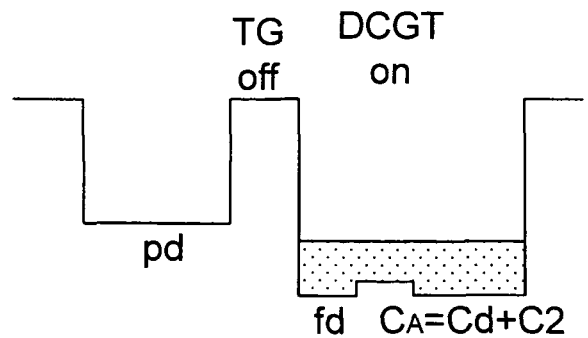

FIGS. 4A-4B show the second embodiment of the present invention. This embodiment has a first difference from the first embodiment in that, the reset transistor RST is coupled in series to one end of the dual conversion gain transistor DCGT, and another end of the dual conversion gain transistor DCGT is coupled to the floating diffusion node fd. A second difference is that the variable capacitor CA includes diffusion capacitors Cd1 and Cd2, which are N-type doped regions formed in the P-type substrate, and an electrode which receives the adjustment voltage VC1. Note that in this embodiment, the electrode and the P-type substrate below the electrode separate the diffusion capacitors Cd1 and Cd2, such that when the adjustment voltage VC1 is at different levels, such as 0 or 1, the capacitance of the variable capacitor CA will be different values of capacitance, such as Cd1 or Cd1+C1+Cd (if a capacitor having a capacitance C1 is formed between the electrode and the substrate), or Cd1+Cd2 (if the adjustment voltage VC1 simply conducts the diffusion capacitors Cd1 and Cd2).

FIGS. 5A-5F show the third embodiment of the present invention. This embodiment is different from the first embodiment in that, in this embodiment, two sets of data are stored in reading the signal, i.e., after the first image signal sample transistor SHS1 of the image signal sample and hold circuit 22 is turned ON to read the floating diffusion charges as the pixel image signal and to store the pixel image signal in the first image signal sample and hold capacitor CS1, the second image signal sample transistor SHS2 of the image signal sample and hold circuit 22 is turned ON to read the floating diffusion charges for a second time, the read-out signal is stored in the second image signal sample and hold capacitor CS2. At these two times of reading the floating diffusion charges, the floating diffusion node fd is connected with and disconnected from the variable capacitor CA respectively, to obtain data of different levels.

FIG. 6 shows the fourth embodiment of the present invention. This embodiment is different from the first embodiment in that, in this embodiment, the reset transistor RST and the dual conversion gain transistor DCGT are electrically connected to the floating diffusion node fd in common.

FIG. 7 shows a system circuit embodiment of the present invention. This embodiment shows a high dynamic range imager apparatus, including: an image sensor device array 71, a digital-to-analog conversion circuit 72, and an image process circuit 73, which are preferably integrated in an integrated circuit. The image sensor device array 71 includes multiple image sensor devices, which are arranged in multiple rows and columns; and a signal reading circuit. The image sensor device and the signal reading circuit can be any one described in the above embodiments. The digital-to-analog conversion circuit 72 is coupled to the signal reading circuit 20, which converts the read-out pixel image signal to a digital image signal. The image process circuit 73 is coupled to the digital-to-analog conversion circuit 72, which processes the digital image signal.

As the above description and figures illustrate, the present invention can adjust the variable capacitor CA according to different light conditions (for example, according to different light intensities of the environment), and obtain various levels of the signal, such that the present invention can generate a more precise image than the prior art. Certainly, if the variable capacitor CA needs to be adjusted according to different light conditions, intensity of the sensed light needs to be determined, and the conversion gain signal and/or the adjustment voltage should be determined according to the intensity. This can be done in various ways. A first way is to determined the light intensity by the image process circuit 73 and feedback control the image sensor device array 71; for example, the output of the digital-to-analog conversion circuit 72 or any signal relating to the light intensity can be compared with one or multiple threshold values, and the conversion gain signal and/or the adjustment voltage are determined according to the comparison result (as shown in FIG. 7). Another way is to determined the light intensity by providing a light intensity detection and determination circuit 74, which senses light intensity and determines the conversion gain signal or the adjustment voltage accordingly (as shown in FIG. 8).

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the substrate of the present invention is not limited to the P-type substrate, but it may be an N-type substrate or other kinds of semiconductor substrates, with corresponding modifications to the doped region(s). For another example, a device which does not substantially influence the primary function of a signal can be inserted between any two devices in the shown embodiments, such as a switch. For yet another example, the number and the shape of the electrode(s) are not limited to what are shown in the embodiments and figures, i.e., one or two in number and rectangle in shape, but the electrode(s) may have any other arbitrary shape and number. For another example, the adjustment voltage is not limited to two options of 0 and 1, but it may be a digital signal with multiple digits or an analog signal. In view of the foregoing, the spirit of the present invention should cover all such and other modifications and variations, which should be interpreted to fall within the scope of the following claims and their equivalents.

What is claimed is:

1. A high dynamic range imager circuit, comprising:
    an image sensor device formed in a first conductive type substrate, including:
        a photosensor unit for receiving a light signal to generate and accumulate photo-generated charges;
        a floating diffusion node for storing floating diffusion charges;
        a transfer gate for coupling the photosensor unit to the floating diffusion node to transfer at least portion of the photo-generated charges to the floating diffusion node as the floating diffusion charges;
        at least one variable capacitor having a capacitance which is adjustable according to an adjustment voltage; and
        a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges; and
    a signal reading circuit coupled to the image sensor device, for converting the floating diffusion charges to a signal which indicates a pixel image sensed by the image sensor device.

2. The imager circuit of claim 1, wherein the variable capacitor includes:
    a second conductive type region, which is formed in the first conductive type substrate; and
    at least one electrode, which is formed in the first conductive type substrate, for receiving the adjustment voltage to adjust the capacitance of the variable capacitor;
    wherein (1) an area of the electrode is controllable by the adjustment voltage to adjust the capacitance of the variable capacitor, or (2) the second conductive type region is divided to a plurality of regions by the electrode and the electrode is controllable by the adjustment voltage to selectively conduct one or more of the plurality of regions to adjust the capacitance of the variable capacitor.

3. The imager circuit of claim 1, wherein the image sensor device further includes a reset transistor, which is coupled to the floating diffusion node, for resetting the floating diffusion node to a predetermined level.

4. The imager circuit of claim 1, wherein the photosensor unit includes a photodiode, a photogate, or a photoconductor.

5. The imager circuit of claim 3, wherein the image sensor device further includes a source follower, which is coupled to the floating diffusion node to convert the floating diffusion charges to the signal which indicates the pixel image sensed by the image sensor device.

6. The imager circuit of claim 5, wherein the image sensor device further includes a row selection transistor coupled to the source follower, the row selection transistor being controlled by a row selection signal, which enables the row selection transistor to receive the signal indicating the pixel image sensed by the image sensor device.

7. The imager circuit of claim 5, wherein the signal reading circuit includes:
    a reset signal sample and hold circuit, including a reset signal sample transistor and a reset signal sample and hold capacitor coupled to the reset signal sample transistor, for sampling and holding a reset signal, the reset signal being converted by the source follower from the predetermined level of the floating diffusion node; and
    an image signal sample and hold circuit, including:
        a first image signal sample transistor and a first image signal sample and hold capacitor coupled to the first image signal sample transistor, for sampling and holding the signal indicating the pixel image sensed by the image sensor device for a first time; and
        a second image signal sample transistor and a second image signal sample and hold capacitor coupled to the second image signal sample transistor, for sampling and holding the signal indicating the pixel image sensed by the image sensor device for a second time.

8. A high dynamic range image sensor device, comprising:
a photosensor unit for receiving a light signal to generate and accumulate photo-generated charges;
a floating diffusion node for storing floating diffusion charges;
a transfer gate for coupling the photosensor unit to the floating diffusion node to transfer at least portion of the photo-generated charges to the floating diffusion node as the floating diffusion charges;
at least one variable capacitor having a capacitance which is adjustable according to an adjustment voltage; and
a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges.

9. The image sensor device of claim 8, wherein the variable capacitor includes:
a second conductive type region, which is formed in the first conductive type substrate; and
at least one electrode, which is formed in the first conductive type substrate, for receiving the adjustment voltage to adjust the capacitance of the variable capacitor;
wherein (1) an area of the electrode is controllable by the adjustment voltage to adjust the capacitance of the variable capacitor, or (2) the second conductive type region is divided to a plurality of regions by the electrode and the electrode is controllable by the adjustment voltage to selectively conduct one or more of the plurality of regions to adjust the capacitance of the variable capacitor.

10. The image sensor device of claim 8, further including a reset transistor, which is coupled to the floating diffusion node, for resetting the floating diffusion node to a predetermined level.

11. The image sensor device of claim 8, wherein the photosensor unit includes a photodiode, a photogate, or a photoconductor.

12. The image sensor device of claim 10, further including a source follower, which is coupled to the floating diffusion node to convert the floating diffusion charges to a signal which indicates the pixel image sensed by the image sensor device.

13. A high dynamic range imager apparatus, comprising:
an image sensor device array, including:
a plurality of image sensor devices arranged in a plurality of rows and columns, each of the image sensor devices including:
a photosensor unit for receiving a light signal to generate and accumulate photo-generated charges;
a floating diffusion node for storing floating diffusion charges;
a transfer gate for coupling the photosensor unit to the floating diffusion node to transfer at least portion of the photo-generated charges to the floating diffusion node as the floating diffusion charges;
at least one variable capacitor having a capacitance which is adjustable according to an adjustment voltage; and
a dual conversion gain transistor coupled between the floating diffusion node and the variable capacitor, for receiving a conversion gain signal and electrically coupling the floating diffusion node to the variable capacitor in response to the conversion gain signal, for adjusting a gain of reading the floating diffusion charges;
a signal reading circuit coupled to the image sensor device, for converting the floating diffusion charges to a signal which indicates a pixel image sensed by the image sensor device;
a digital-to-analog conversion circuit coupled to the signal reading circuit, for converting the signal indicating the pixel image sensed by the image sensor device to a digital image signal; and
an image process circuit coupled to the digital-to-analog conversion circuit, for processing the digital image signal.

14. The imager apparatus of claim 13, wherein the variable capacitor includes:
a second conductive type region, which is formed in the first conductive type substrate; and
at least one electrode, which is formed in the first conductive type substrate, for receiving the adjustment voltage to adjust the capacitance of the variable capacitor;
wherein (1) an area of the electrode is controllable by the adjustment voltage to adjust the capacitance of the variable capacitor, or (2) the second conductive type region is divided to a plurality of regions by the electrode and the electrode is controllable by the adjustment voltage to selectively conduct one or more of the plurality of regions to adjust the capacitance of the variable capacitor.

15. The imager apparatus of claim 13, wherein the image process circuit feedback controls the conversion gain signal or the adjustment voltage.

16. The imager apparatus of claim 13, further including a light intensity determination circuit, which senses light intensity and controls the conversion gain signal or the adjustment voltage according to the light intensity.

17. The imager apparatus of claim 13, wherein the signal reading circuit includes:
a reset signal sample and hold circuit, including a reset signal sample transistor and a reset signal sample and hold capacitor coupled to the reset signal sample transistor, for sampling and holding a reset signal, the reset signal being converted by the source follower from the predetermined level of the floating diffusion node; and
an image signal sample and hold circuit, including:
a first image signal sample transistor and a first image signal sample and hold capacitor coupled to the first image signal sample transistor, for sampling and holding the signal indicating the pixel image sensed by the image sensor device for a first time; and
a second image signal sample transistor and a second image signal sample and hold capacitor coupled to the second image signal sample transistor, for sampling and holding the signal indicating the pixel image sensed by the image sensor device for a second time.

18. A method of reading a high dynamic range image, comprising:
receiving a light signal to generate and accumulate photo-generated charges;
transferring at least portion of the photo-generated charges to a floating diffusion node as floating diffusion charges according to a transfer signal;
electrically coupling the floating diffusion node to a variable capacitor according to a conversion gain signal, for adjusting a gain of reading the floating diffusion charges, wherein the variable capacitor has a capacitance which is adjustable according to an adjustment voltage; and
reading the floating diffusion charges as a first signal, which indicates a sensed pixel image.

19. The method of claim 18, further comprising: reading the floating diffusion charges as a second signal, wherein the first signal and the second signal are respectively read at timings when the floating diffusion node is and is not coupled to the variable capacitor.

20. The method of claim 18, further comprising: sensing light intensity and controlling the conversion gain signal or the adjustment voltage according to the sensed light intensity.

* * * * *